(12) United States Patent
Kim

(10) Patent No.: US 8,093,125 B2
(45) Date of Patent: Jan. 10, 2012

(54) MANUFACTURING METHOD OF CAPACITOR IN SEMICONDUCTOR DEVICE

(75) Inventor: Ji Hye Kim, Seoul (KR)

(73) Assignee: Hynix Semiconductor, Inc., Icheon (KR)

(*) Notice: Subject to any disclaimer, the term of this patent is extended or adjusted under 35 U.S.C. 154(b) by 50 days.

(21) Appl. No.: 12/650,051

(22) Filed: Dec. 30, 2009

(65) Prior Publication Data

US 2011/0070716 A1 Mar. 24, 2011

(30) Foreign Application Priority Data

Sep. 18, 2009 (KR) .................. 10-2009-0088371

(51) Int. Cl.
*H01L 21/02* (2006.01)
(52) U.S. Cl. .. 438/259; 438/266; 438/270; 257/E21.008
(58) Field of Classification Search .................. 438/259, 438/266, 270, 589
See application file for complete search history.

(56) References Cited

U.S. PATENT DOCUMENTS

| 7,928,504 | B2 * | 4/2011 | Choi | 257/326 |
| 2007/0037344 | A1 * | 2/2007 | Ema | 438/238 |

FOREIGN PATENT DOCUMENTS

| KR | 1020010029819 A | 4/2001 |
| KR | 1020030058602 A | 7/2003 |
| KR | 1020040006513 A | 1/2004 |
| KR | 1020050034879 A | 4/2005 |

* cited by examiner

*Primary Examiner* — Alexander Ghyka (57) ABSTRACT

Example embodiment is provided to a method for manufacturing a semiconductor device, including forming a hard mask layer on a buried bit line and forming a storage node contact hole by using the selectivity between an interlayer insulating layer and the hard mask layer, thereby forming a contact hole using a mask of a line pattern instead of a hole pattern. Accordingly, a mask for the contact hole can be easily fabricated and the contact area can be maximized, thereby reducing the contact resistance.

16 Claims, 13 Drawing Sheets

MANUFACTURING METHOD OF CAPACITOR IN SEMICONDUCTOR DEVICE

CROSS-REFERENCES TO RELATED APPLICATION

Priority to Korean patent application number 10-2009-0088371, filed on Sep. 18, 2009, which is incorporated by reference in its entirety, is claimed.

BACKGROUND OF THE INVENTION

The embodiments described herein relate to a method for manufacturing a semiconductor device and, more particularly, to a method for manufacturing a semiconductor device being capable of easily forming a hole type contact hole in a highly integrated semiconductor device and maximizing an open area of an active region.

So as to increase integration of the semiconductor device, various methods that integrate more circuit patterns in the limited area by modifying cell layout have been suggested. One of the methods is to modify an arrangement of the active regions which transistors are embedded therein from an $8F^2$ cell layout to a $6F^2$ cell layout.

In a DRAM, word lines are arranged to be orthogonally crossed to bit lines and active regions are repeatedly arranged to be obliquely crossed to the word line in the main axis direction of the active region in the $6F^2$ cell layout. The active regions of oblique patterns are arranged in rectangular patterns which are obliquely elongated to be crossed to the bit lines at an angle of about 27 degree.

As another method to increase integration of the semiconductor device, a recess gate or a buried gate has been used instead of the prior planar gate having a horizontal channel region.

In the buried gate structure, an isolation gate is used to form a bit line contact and a storage node contact in a line type. However, it increases a cell area of the chip dimension and a leakage current as compared with a conventional trench type isolation layer.

The more an integration of the semiconductor device is increased, the more the critical dimension (CD) of the contact hole pattern is reduced. Accordingly, it is difficult to define the contact hole pattern of a hole type on the mask and the active region is not open in etching process of the hole type contact hole. Furthermore, when the hole type contact is used, all the open area of the active region can not be used such that the contact resistance is increased.

BRIEF SUMMARY OF THE INVENTION

The inventive concept provides an improved contact hole formation method being capable of fine patterning and ensuring the contact area between a contact and an active region at a maximum.

According to one aspect of an example embodiment, a method for manufacturing a semiconductor device includes forming an isolation structure defining an active region, forming gates buried within the active region and the isolation structure, forming an interlayer insulating layer over the active region and the isolation structure, forming a bit line within a trench of the interlayer insulating layer, the bit line having a first hard mask layer stacked thereon, forming a storage node contact hole exposing a storage node contact region of the active region by using a difference in an etch characteristic between the interlayer insulating layer and the first hard mask layer, and filling storage node material within the storage node contact hole to form a storage mode contact.

In an example embodiment, the storage node contact hole is formed by using the selectivity between the interlayer insulating layer and the first hard mask layer, thereby forming a contact hole by using a mask of a line pattern instead of a hole pattern. Accordingly, a mask for the contact hole can be easily fabricated and the contact area can be maximized, thereby reducing the contact resistance.

In an exemplary embodiment, the bit line having a narrow portion and a wide portion connected to the narrow portion to resemble a dog bone shape. The forming a bit line within the interlayer insulating layer may include forming a bit line groove having a shape resembling the dog bone shape in the interlayer insulating layer, forming the bit line in a lower portion of the bit line groove, and forming the first hard mask layer over the bit line to be filled in the bit line groove. The forming a bit line within the interlayer insulating layer may further include forming a spacer insulating layer on the inner surface of the bit line groove and removing a portion of the spacer insulating layer formed on a bottom surface of the bit line contact region among the inner surface of the bit line groove.

In an exemplary embodiment, the forming a bit line groove of the dog bone shape may include forming a trench in the interlayer insulating layer by using a first bit line mask that defines a line type bit line region, forming a second hard mask layer on the interlayer insulating layer to be buried within the trench, etching the interlayer insulating layer and the second hard mask layer by using a second bit line mask which defines a hole type bit line contact region, and removing the second hard mask layer remaining within the trench, wherein the line-type bit line region corresponds to the narrow portion of the bit line and the hole type bit line contact region corresponds to the wide portion of the bit line.

Herein, the second hard mask layer may be formed of an amorphous carbon layer (ACL) or a spin on coating (SOC) type polymer.

The bit line may be formed of stack structure of a barrier metal layer and a bit line conduction layer. The forming a bit line may include forming the barrier metal layer on the inner surface of the bit line groove, forming the bit line conduction layer on the barrier metal layer within the bit line groove, and etching back the barrier metal layer and the bit line conduction layer.

The forming a storage node contact hole for exposing a storage node contact region of the active region may include forming a photosensitive pattern exposing portions of the interlayer insulating layer and the first hard mask layer which are provided on regions between the gates, and etching the exposed portions of the interlayer insulating layer and the first hard mask layer until the active region in the storage node contact region is exposed by using the photosensitive pattern as an etch mask.

Herein, the photosensitive pattern having line patterns may be provided on the regions between the gates such that the portions of the interlayer insulating layer and the first hard mask layer corresponding to the regions are exposed.

Meanwhile, the photosensitive pattern having a plurality of line patterns may be arranged on the regions between the gates, each of the plurality of line pattern having a length including adjacent two storage node contact regions such that each of the plurality of line patterns exposes the portions of the interlayer insulating layer and the first hard mask layer.

These and other features, aspects, and embodiments are described below in the section entitled "DESCRIPTION OF THE EMBODIMENTS".

BRIEF DESCRIPTION OF THE DRAWINGS

The above and other aspects, features and other advantages of the subject matter of the present disclosure will be more clearly understood from the following detailed description taken in conjunction with the accompanying drawings, in which:

FIGS. 2a through 12a are sectional views in a Y-axis direction of FIG. 1;

FIGS. 2b through 12B are sectional views in a X-axis direction of FIG. 1; and

DESCRIPTION OF EMBODIMENTS

Hereinafter, embodiments of the present invention will now be described more fully with reference to the accompanying drawings. The embodiments may, however, be embodied in many different forms and should not be construed as being limited to the instances set forth herein. Rather, the embodiments herein are merely provided to help convey various concepts to those of ordinary skill in the art. In the drawings, the size of each element may have been exaggerated for clarity. Like reference numerals denote like elements throughout.

Figure 1:
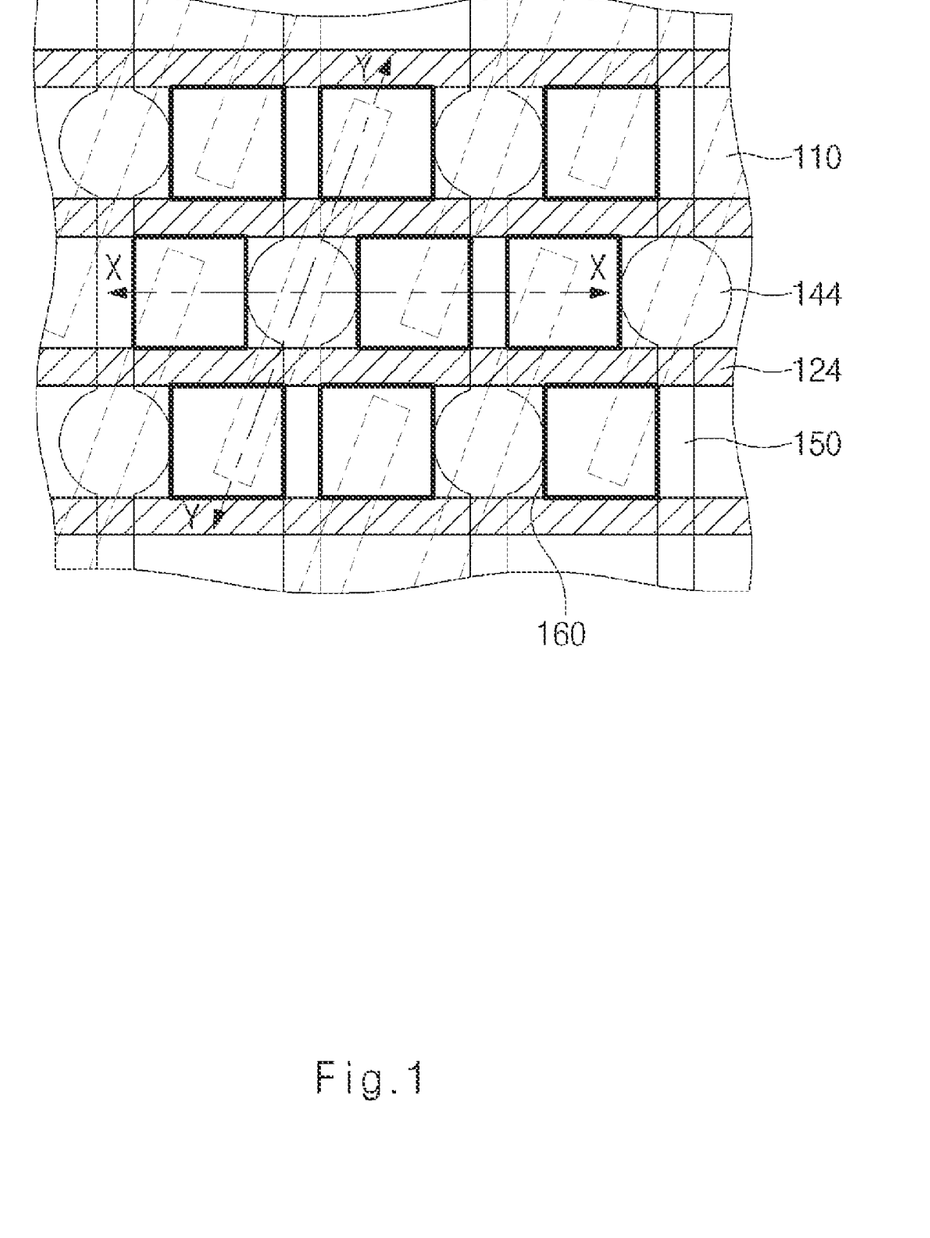
FIG. 1 a plan view illustrating a layout of a semiconductor device according to an embodiment of the present invention.

FIG. 1 is a layout of a semiconductor device according to an embodiment of the present invention.

Active regions 110 defined by an isolation layer are formed in a semiconductor substrate. Each of active regions 110 is arranged to be crossed with two gates 124.

The bit lines 150 are arranged to be orthogonally crossed to the gates 124. The bit lines 150 are arranged to be obliquely crossed to the active regions 110 in a major axis of the active region 110. That is, FIG. 1 shows a layout of $6F^2$. At this time, so as to ensure a storage node contact region as large as possible, each of the bit lines 150 is configured to have a dog bone shape such that a critical dimension (CD) of the bit line 150 is formed small and the bit line contact region 144 contacted with the active region 110 is largely formed in a hole type. In the embodiment of the present invention, the bit line contact region 144 is formed in a circular type. In particular, the bit line 150 has a stack structure of a barrier metal layer (not shown) and a conduction layer (not shown). The bit line 150 is formed in a damascene bit line type buried in a groove.

Each of the gates 124 is formed in buried gate structures such that portions of the gate 124 which are crossed to the active regions are completely buried within recesses (not shown).

Each of storage node contacts 160 is formed to be contacted with edges of the bit line contact regions 144 which the storage node contact 160 is arranged between. At this time, storage node contact holes (not shown) in which the storage node contacts 160 are formed therein are formed by using a mask of a line type which extends between the gates 124 in a parallel direction.

FIGS. 2 through 12 are sectional views illustrating a method for manufacturing the semiconductor device of FIG. 1, wherein (a) in FIGS. 2 through 12 are sectional views in a Y-axis direction of FIG. 1 and (b) in FIGS. 2 through 12 are sectional views in a X-axis direction of FIG. 1.

Figure 2:
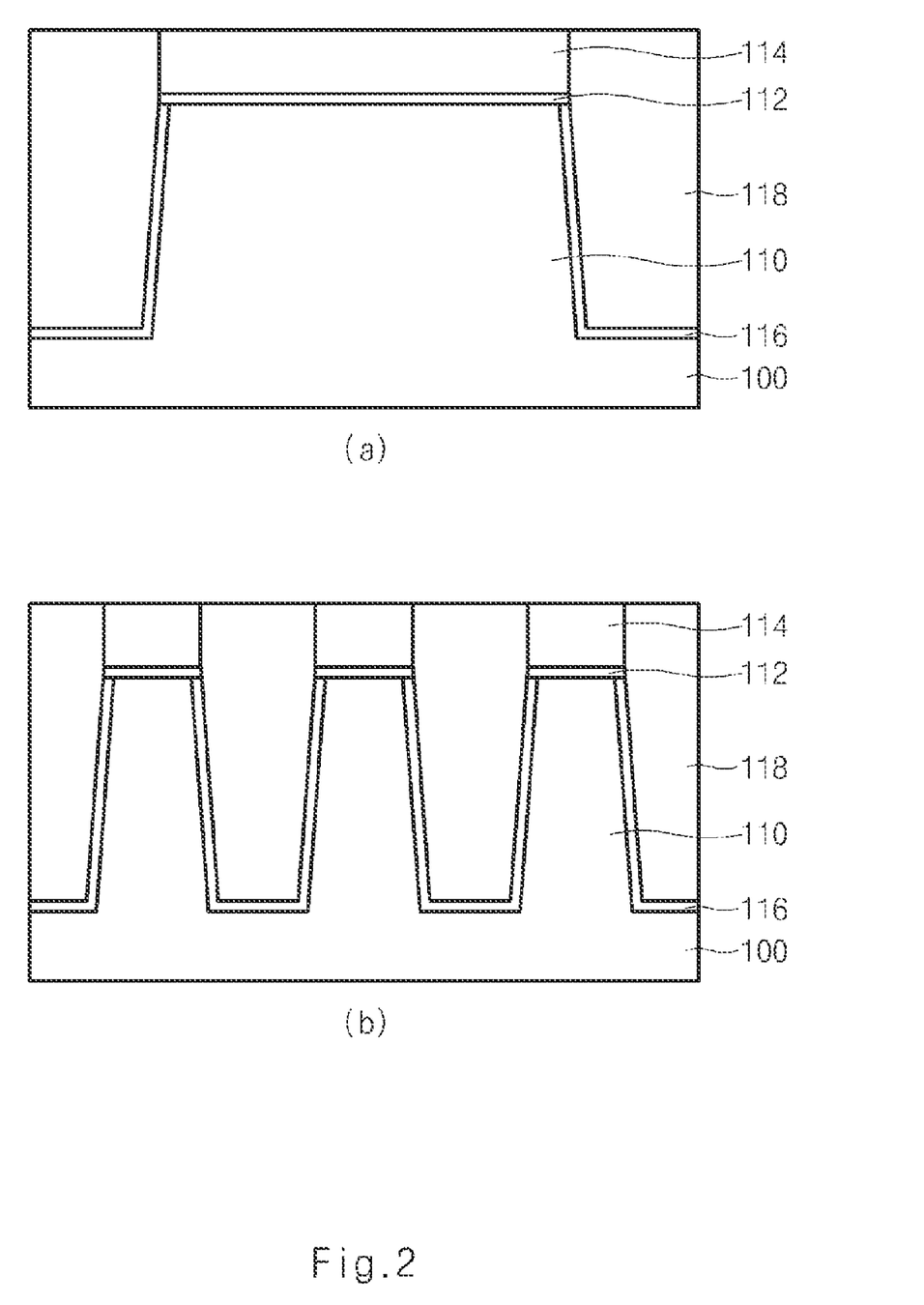

Referring to FIG. 2, a pad oxide layer (not shown) and a hard mask layer (not shown) are sequentially formed on a semiconductor substrate 100. The hard mask layer may be formed of a nitride layer or a polysilicon layer. Subsequently, the hard mask layer and the pad oxide layer are selectively etched until portions of the semiconductor substrate 100 are exposed, thereby forming an isolation mask where the hard mask layer patterns 114 and the pad oxide layer patterns 112 are stacked.

Then, the exposed portions of the semiconductor substrate 100 are etched to a desired depth by using the isolation mask as an etch mask, thereby forming trenches. Side wall oxide layers 116 are formed on surfaces of the trenches.

Then, an insulating layer (not shown) is formed over the semiconductor substrate to fill the trenches. The insulating layer may be formed of an oxide layer. The insulating layer is then planarized until the hard mask layer patterns 114 are exposed, thereby forming an isolation layer 118 defining active regions 110. Before the isolation layer 118 is formed, liner nitride layers (not shown) and liner oxide layers (not shown) may be formed on the side wall oxide layers 116.

In the embodiment, the hard mask layer patterns 114 remain on the surfaces of the active regions 110 such that surfaces of the hard mask layer patterns 114 are coplanar with a surface of the isolation layer 118. When the hard mask layer patterns 114 are formed of a nitride layer, it is easy to form landing plugs on corresponding regions, after the hard mask layer patterns 114 are selectively removed in the following process. Meanwhile, when the hard mask patterns 114 are formed of a polysilicon layer, it is to pattern the polysilicon layer such that polysilicon layer patterns are used as landing plugs.

In another embodiment, without forming the hard mask layer patterns 114 on the active regions 110, selective epitaxial growth (SEG) layers (not shown) may be formed on the active regions 110 through a SEG process such that the surface of the isolation layer 118 is coplanar with surfaces of the SEG layers. In this case, without forming the landing plug, junction layers may be formed by directly implanting impurities into the surfaces of the SEG layers. As above, heights of the junction regions for source/drain can be increased by using the SEG layers such that the plug resistance can be reduced and a gate induced drain leakage (GIDL) can be reduced.

Figure 3:
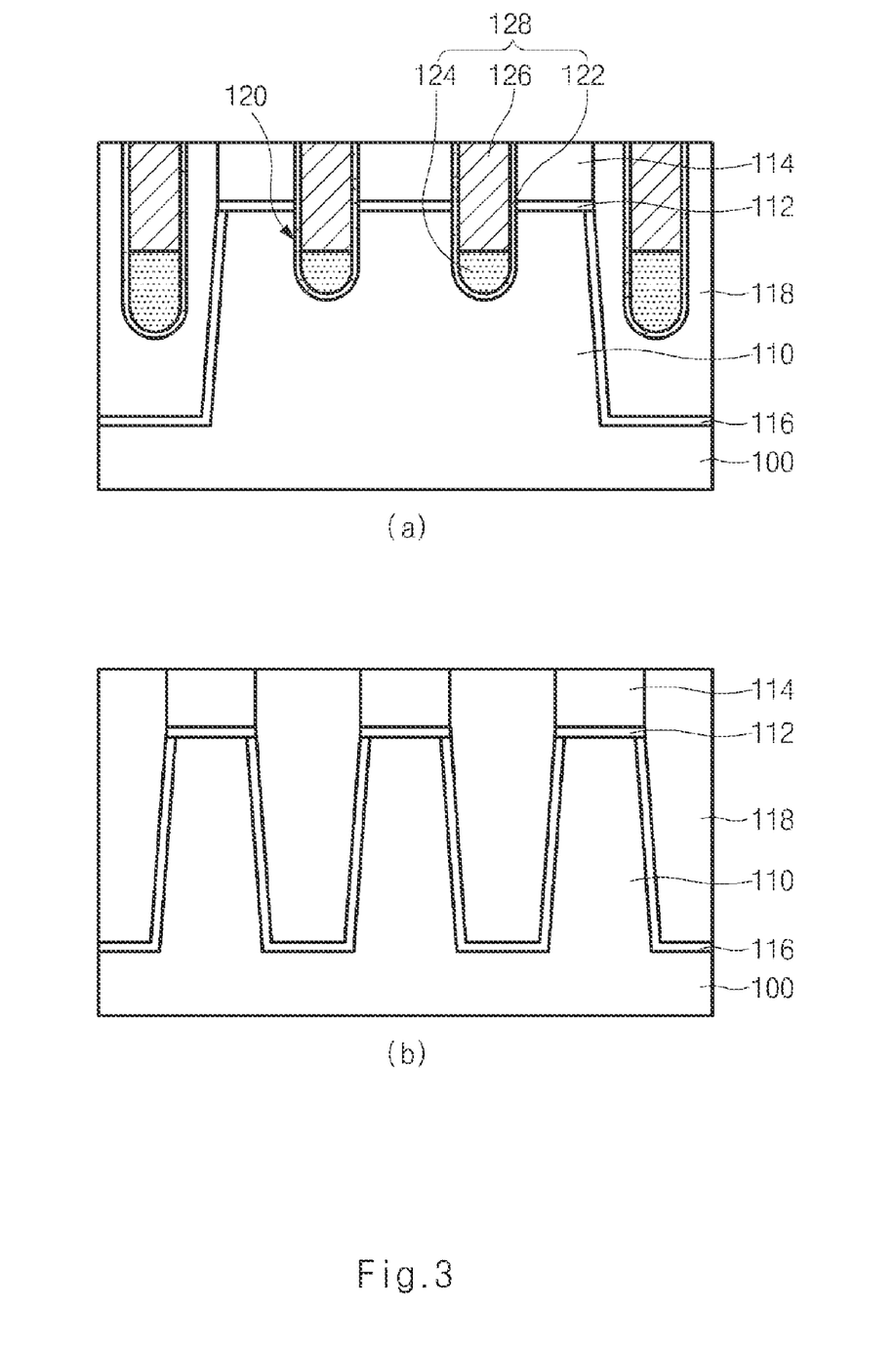

Referring to FIG. 3, the active regions 110 and the isolation layer 118 are etched to a desired depth by using a gate mask (not shown) defining a gate region, thereby forming trenches 120.

Next, gate oxide layers 122 are formed by oxidizing inner surfaces of the trenches 120. A gate electrode material (not shown) is formed on the active regions 110 and the isolation layer 118 filling the trenches 120. The gate electrode material is then planarized and etched back to form gates 124 in a lower portion of the trenches 120. At this time, the gate 124 may comprise of TiN or W.

Next, capping layers 126 for protecting the gates 124 are formed on the gates 124, thereby forming buried gate structures 128.

Figure 4:
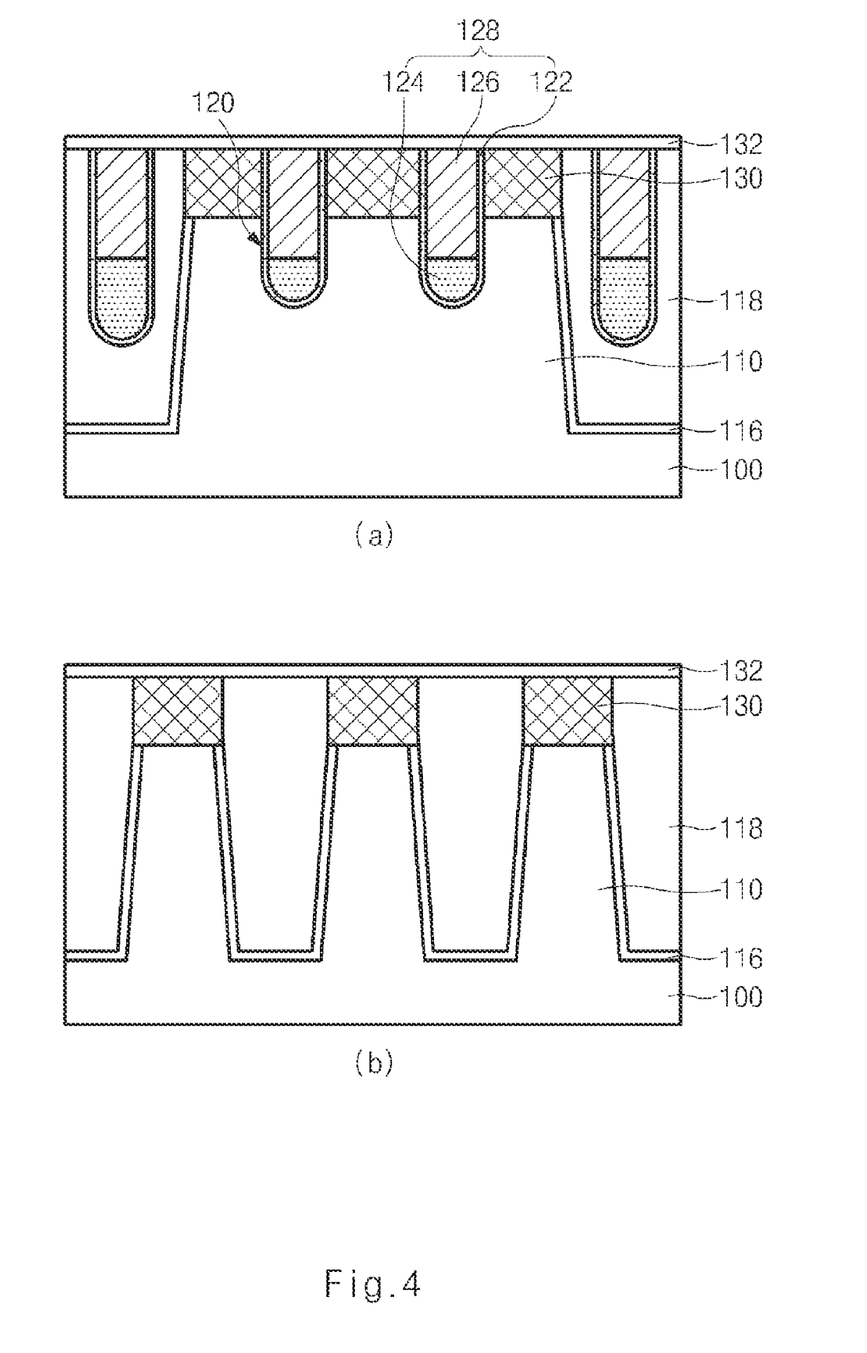

Referring to FIG. 4, the hard mask layer patterns 114 and the pad oxide layer patterns 112 are removed to form a cavity. A landing plug material (not shown) is formed to fill the cavities which are formed by removing the hard mask layer patterns 114 and the pad oxide layer patterns 112. The landing plug material is planarized until the capping layers 126 are exposed, thereby forming landing plugs 130. At this time, the landing plugs 130 may be formed by depositing a doped polysilicon layer or the landing plugs 130 may be formed by depositing undoped polysilicon layer and ion implanting dopants into the undoped polysilicon layer.

Since bit lines are formed by using a damascene process in the embodiment, the landing plugs 130 are formed on the active regions 110 of the semiconductor substrate 100. That is, when the bit lines are formed by using a damascene process, the damage of the semiconductor substrate can be prevented and the junction region can be formed with a shallow depth due to the landing plugs 130. Furthermore, the landing plugs 130 serve as buffers so metal plugs do not directly contact the surfaces of the active regions 110. The contact area between the landing plugs 130 and the active regions 110 can be increased, thereby lowering the plug resistance.

Next, a sealing nitride layer 132 is formed on the landing plugs 130, the buried gate structures 128 and the isolation layer 118 to protect the buried gate structures 128 and the landing plugs 130. At this time, instead of the sealing nitride layer 132, a stack structure of a sealing nitride layer and a sealing oxide layer may be formed.

Figure 5:
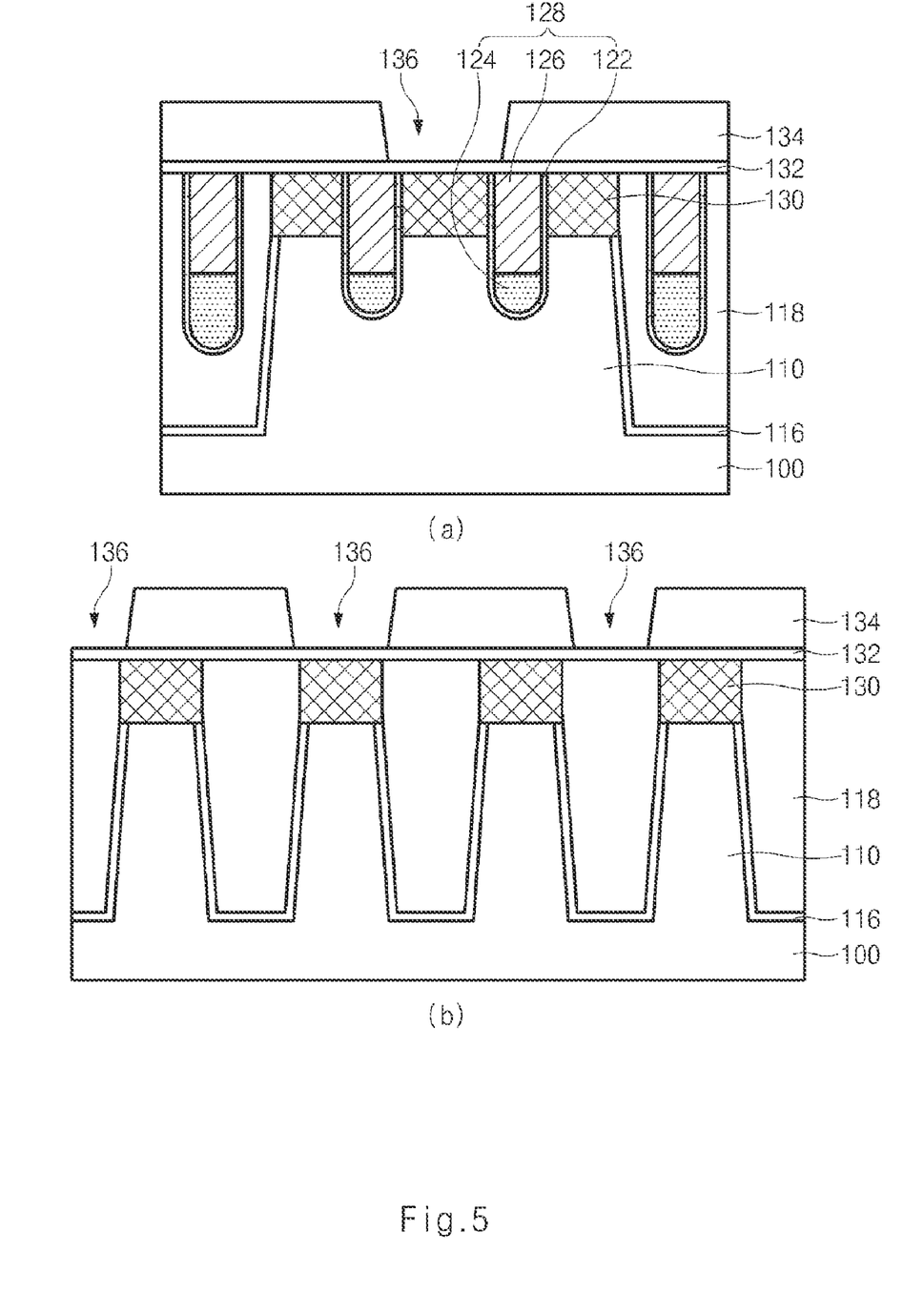

Referring to FIG. 5, an interlayer insulating layer 134 is formed on the sealing nitride layer 132 and then selectively etched to form trenches 136 by using a first bit line mask (not shown) defining line type bit line regions. At this time, the interlayer insulating layer 134 may be formed of a nitride layer.

Figure 6:
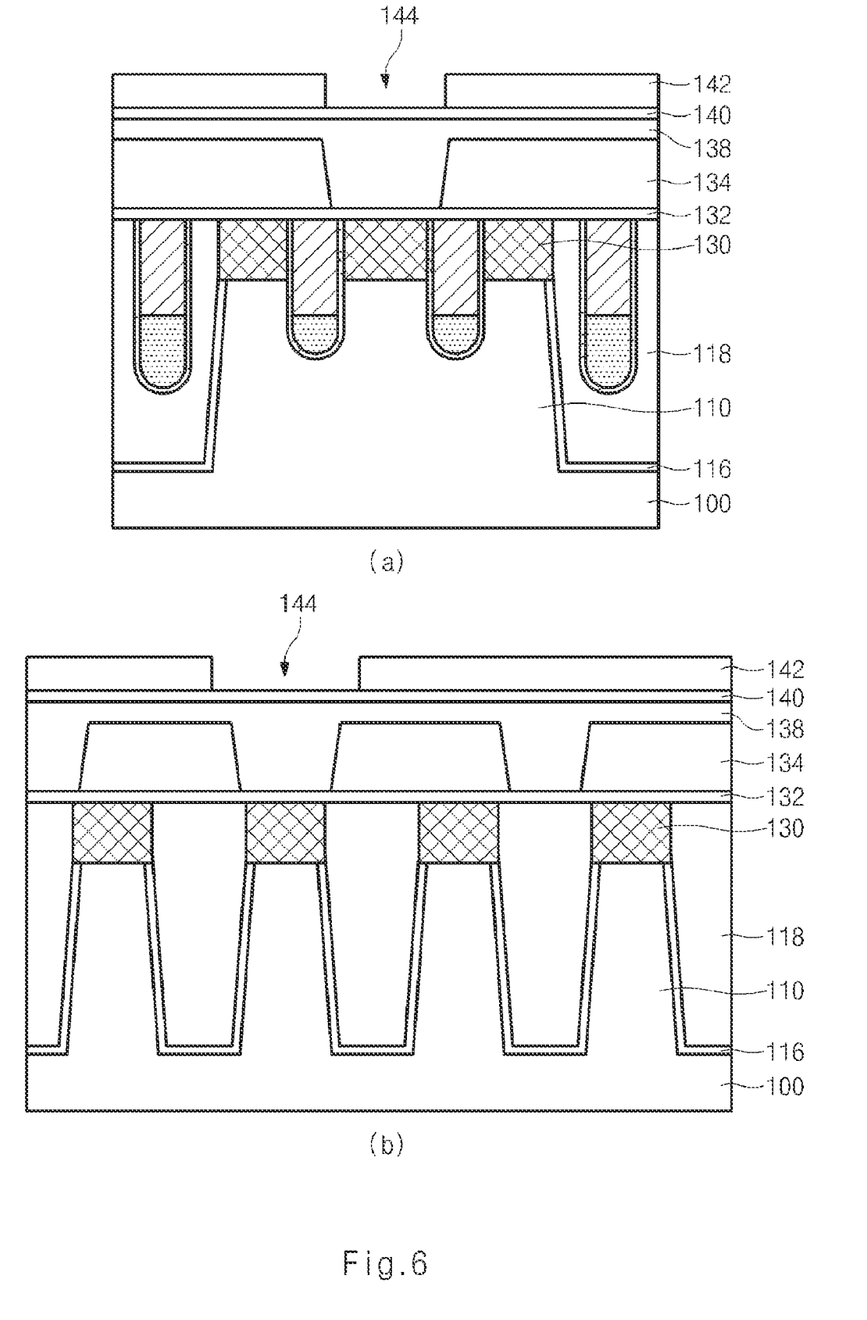

Referring to FIG. 6, a hard mask layer 138 is formed on the interlayer insulating layer 134 to be filled within the trenches 136 and then a silicon oxynitride (SiON) layer 140 is formed on the hard mask layer 138. At this time, the hard mask layer 138 may be formed of an ACL or a SOC type polymer. The silicon oxynitride layer 140 serves as an antireflection (ARC) layer.

Next, a photosensitive layer (not shown) is formed on the silicon oxynitride layer 140 and then patterned by using a second bit line mask (not shown) defining bit line contact regions 144, thereby forming a photosensitive pattern 142. At this time, the bit line contact regions 144 are formed in a hole type having a CD wider than the line type bit line regions 136 so as to form dog bone shaped bit line structures. The bit line contact regions 144 may be formed in a circular type as shown in FIG. 1.

Figure 7:
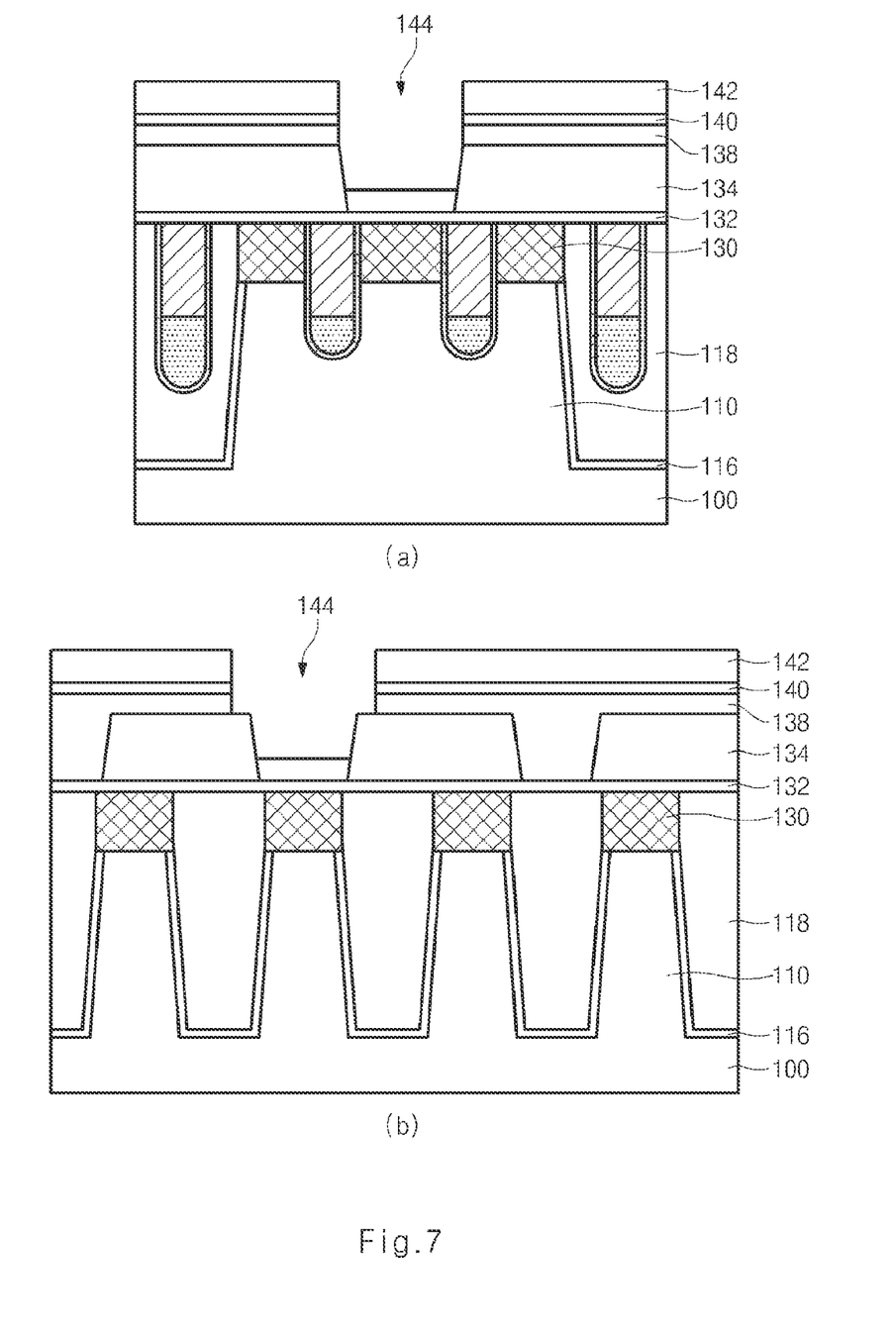
Figure 8:
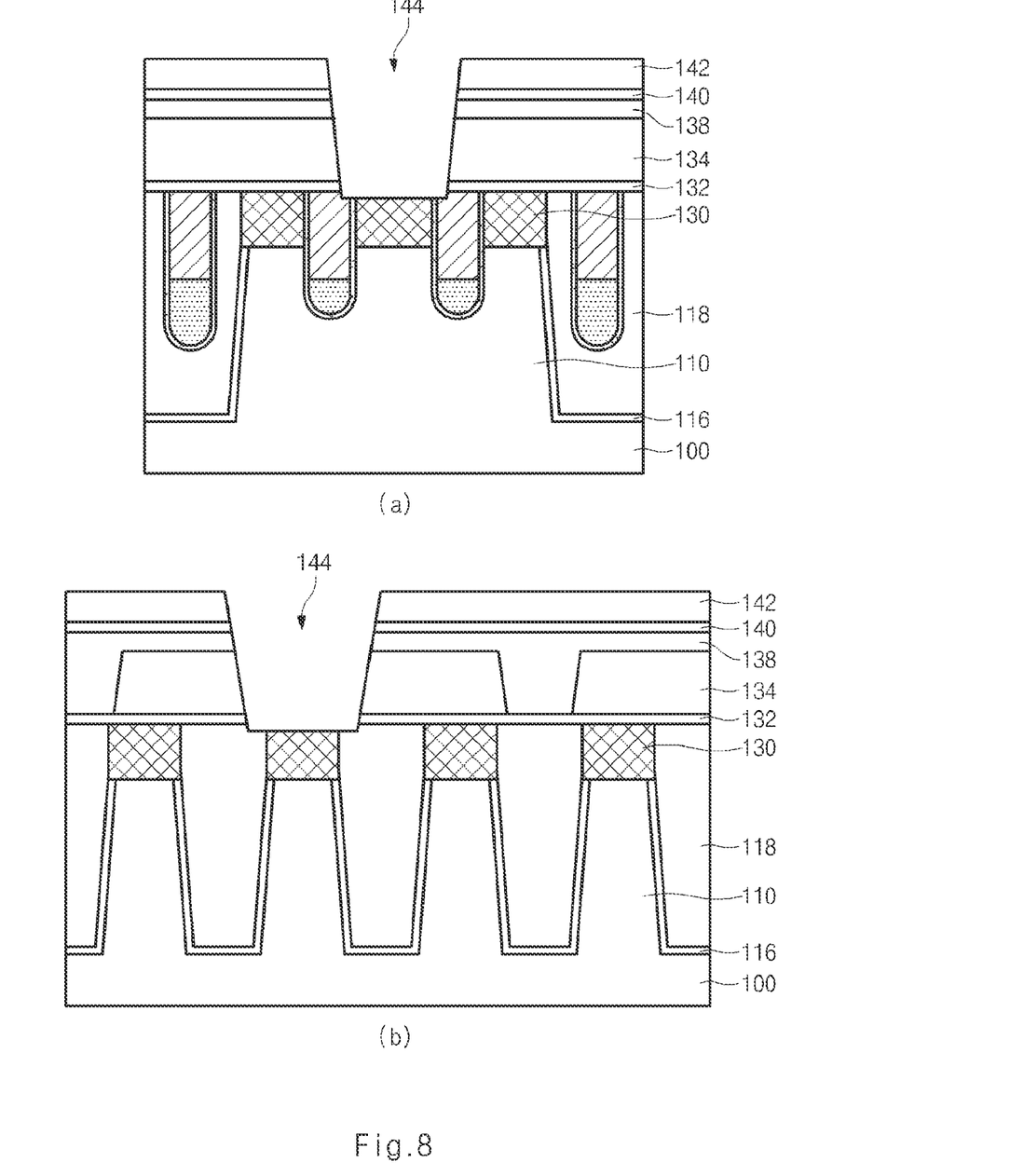

Referring to FIG. 7, the silicon oxynitride layer 140 and the hard mask layer 138 are etched by using the photosensitive pattern 142 as an etch mask until the interlayer insulating layer 134 is exposed. Subsequently, referring to FIG. 8, the interlayer insulating layer 134, the hard mask layer 138 and the sealing nitride layer 132 are etched by using the photosensitive pattern 142, the silicon oxynitride layer 140 and the hard mask layer 138 as an etch mask until the landing plugs 130 are exposed.

Figure 9:
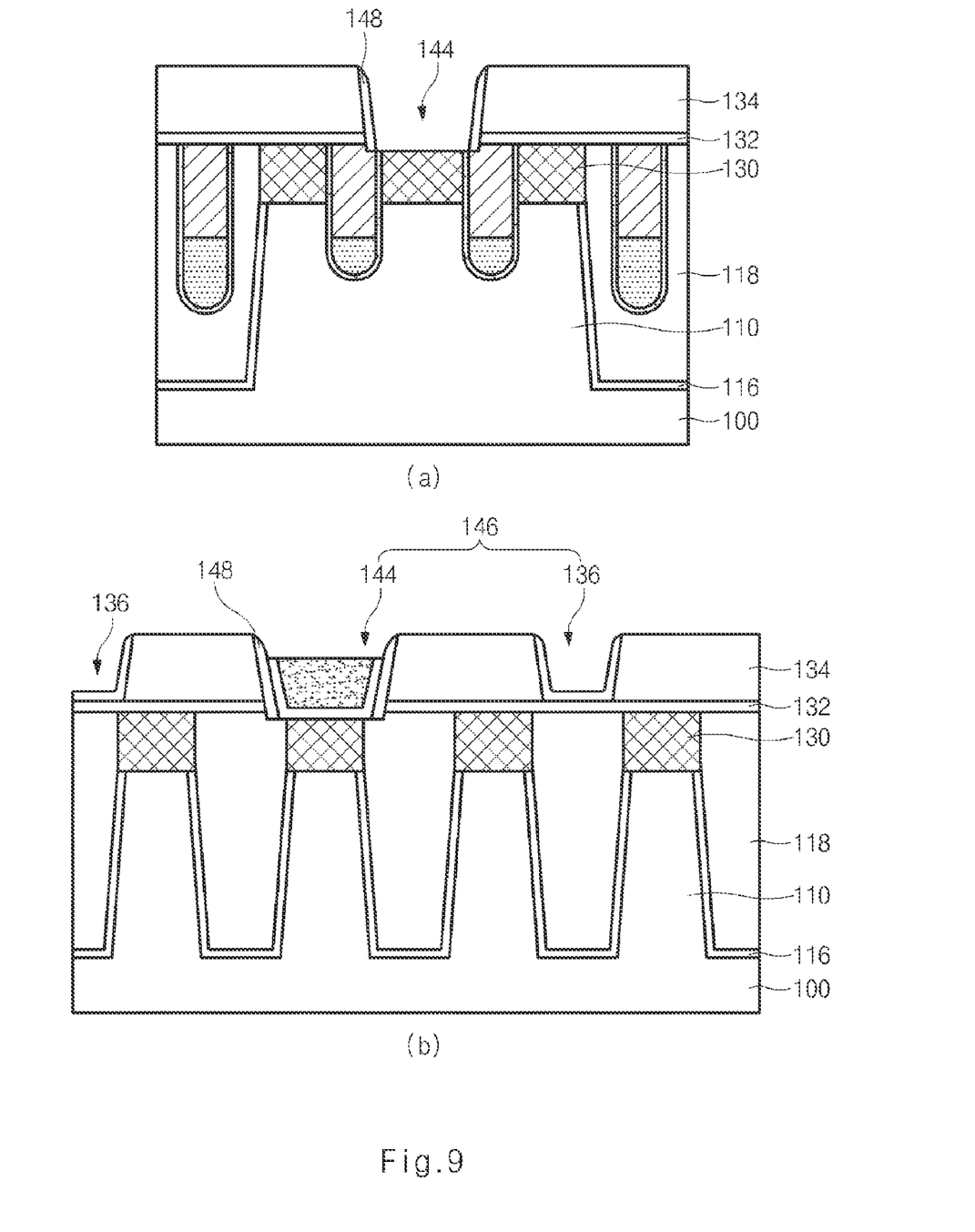

Referring to FIG. 9, all the remaining photosensitive pattern 142, silicon oxynitride layer 140 and hard mask layer 138 are removed. According to this, dog bone shaped bit line grooves 146 are formed by combining the line type bit line regions (a narrow portion) 136 which are formed by using the first bit line mask and the hole type bit line contact regions (a wide portion) 144 which are formed by using the second bit line maskNext, a spacer insulating layers 148 is formed on inner side surfaces and bottom surfaces of the bit line grooves 146. Subsequently, only portions of the spacer insulating layer 148 which are formed on the bottom surfaces of the bit line contact region 144 of the bit line grooves 146 are removed along with the second bit line mask, thereby exposing the landing plugs 130. At this time, the spacer insulating layer 148 may be formed of a nitride layer or an oxide layer of a low dielectric constant.

Figure 10:
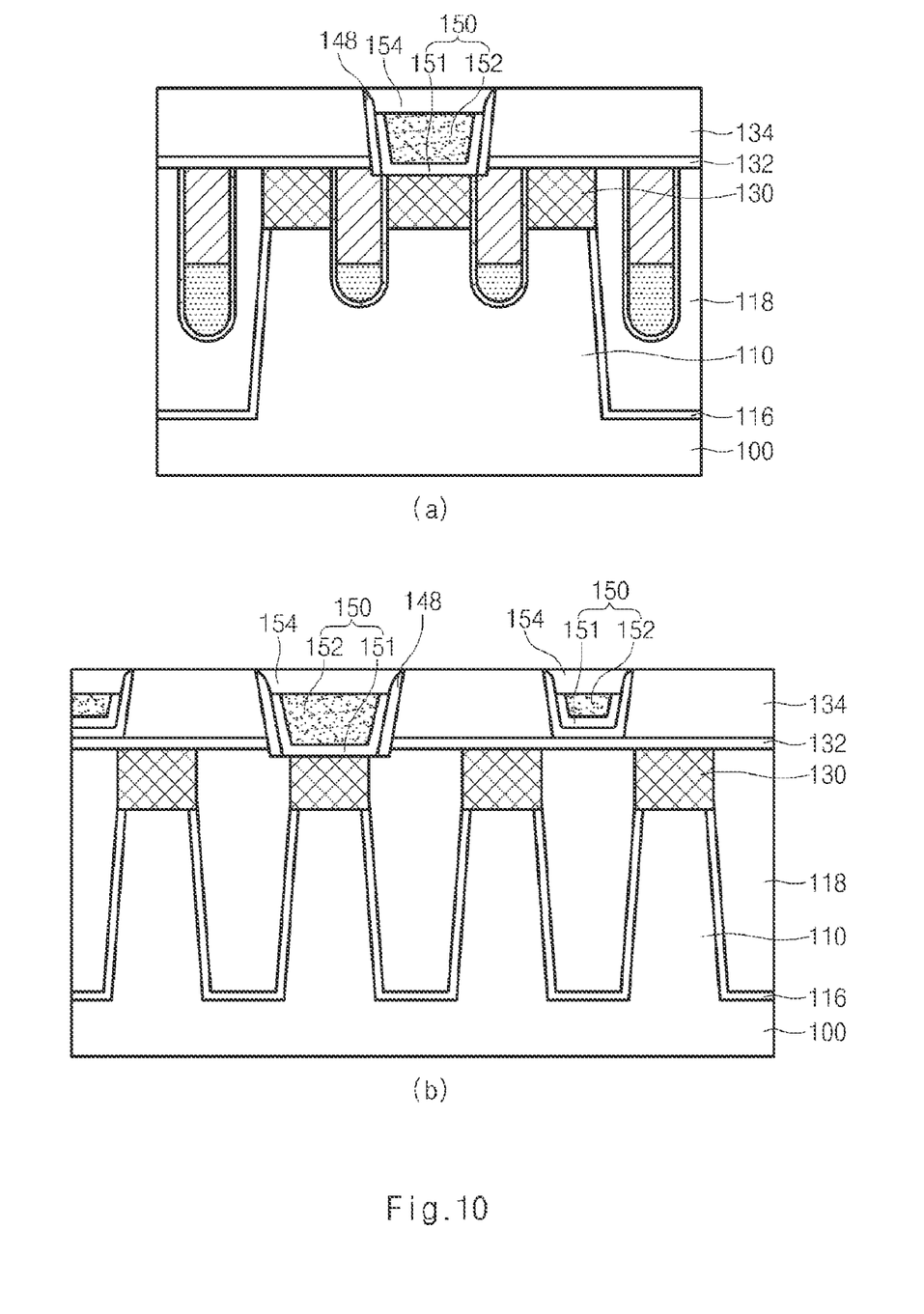

Referring to FIG. 10, bit lines 150 are formed within the bit line grooves 146 which the spacer insulating layers 148 are formed therein.

As for each of the damascene bit lines 150, first, a barrier metal layer 151 is formed on the inner side and bottom surfaces of the bit line groove 146 and a bit line conduction layer 152 is formed on the barrier metal layer 151 to be filled within the bit line groove 146. Next, the barrier metal layer 151 and the bit line conduction layer 152 are etched back to a certain depth so that the barrier metal layer 151 and the bit line conduction layer 152 are formed in a lower portion of the bit line groove 146 at a constant height.

At this time, the barrier metal layer 151 may be formed of Ti/TiN or $Ti_xSi_x$ and the bit line conduction layer 152 may be formed of W. So as to improve an adhesion between the barrier metal layer 151 and the bit line conduction layer 152, a glue layer (not shown) of TiN may be formed at the interface between the barrier metal layer 151 and the bit line conduction layer 152.

Next, a bit line hard mask layer 154 of a nitride layer is formed over the resulting structure filling the step difference between the bit line 150 and interlayer insulating layer 134. At this time, the bit line hard mask layer 154 may be formed of a material having a very low selectivity than the interlayer insulating layer 134. That is, the bit line hard mask layer 154 may be formed of a material harder than the interlay insulating layer 134.

Figure 11:
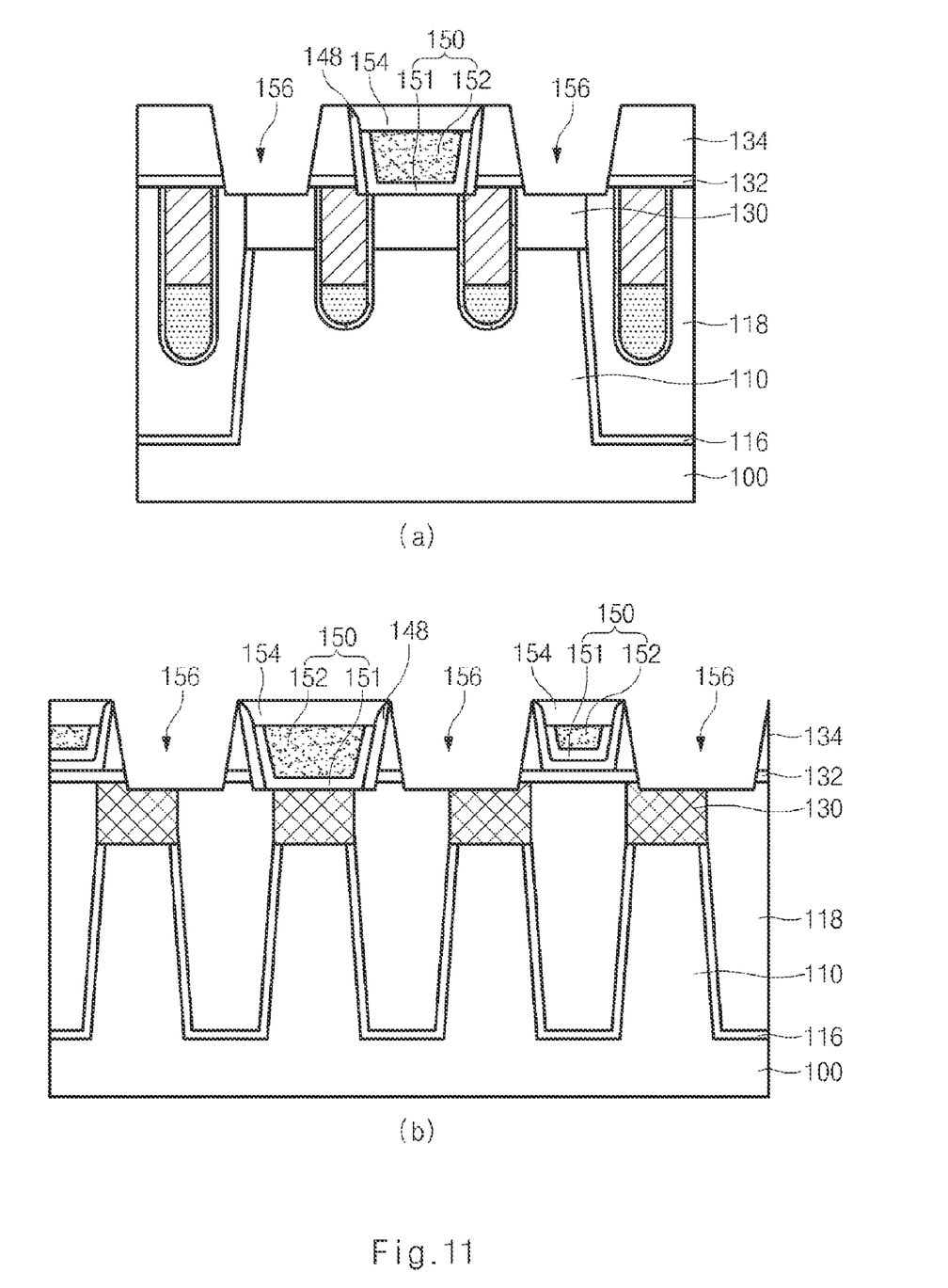

Referring to FIG. 11, a photosensitive layer (not shown) is formed on the interlayer insulating layer 134 and the bit line hard mask layer 154 and patterned using a line type storage node contact mask (see FIG. 13), thereby forming a photosensitive pattern (not shown). At this time, light shading areas of the storage node contact mask corresponds to the gate regions in which the gates 124 are formed therein. That is, the photosensitive pattern exposes portions of the interlayer insulating layer 134 and the bit line hard mask layer 154 between the gates 124 in a line shape.

Next, portions of the interlayer insulating layer 134 are etched by using the photosensitive pattern and the hard mask layer 154 as an etch mask to form storage node contact holes 156. At this time, due to the etch selectivity between the interlayer insulating layer 134 and the bit line hard mask layer 154, the portions of the interlayer insulating layer 134 in the storage node contact regions which are designated with a bolded rectangular shape in FIG. 1 are selectively etched into the storage node contact holes 156 as shown in FIG. 11.

Figure 12:
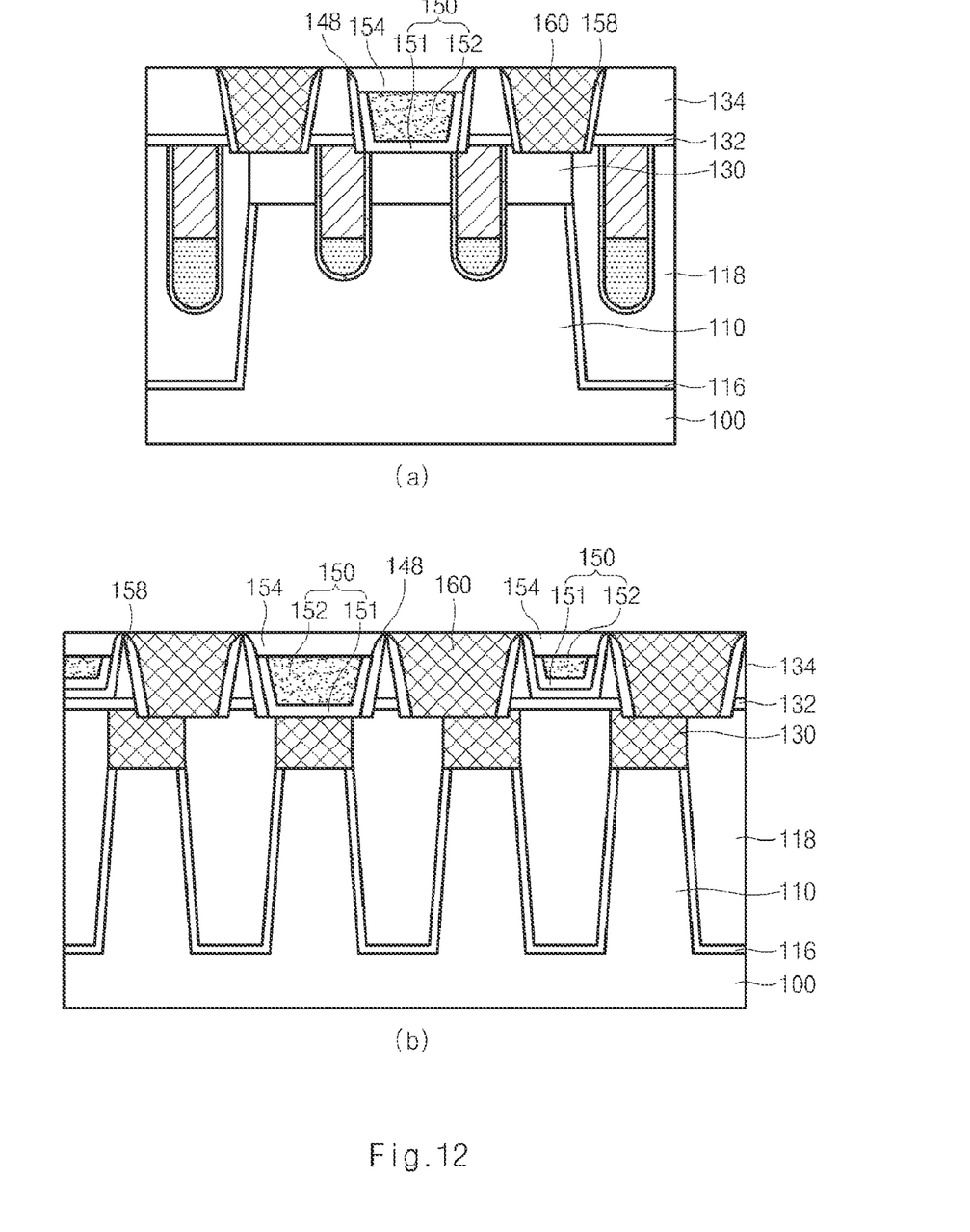

Referring to FIG. 12, spacer insulating layers 158 are formed on the sidewalls of the storage node contact holes 156. Storage node contacts 160 are formed by filling a storage node contact material within the storage node contact holes 156. At this time, the storage node contact material may be formed of a doped polysilicon layer.

Next, although not shown herein, a capacitor is formed on the storage node contacts 160 and metal lines are formed over the capacitor in the following processes.

The above embodiments of the present invention are illustrative and not limitative. Various alternatives and equivalents are possible. Other additions, subtractions, or modifications are obvious in view of the present disclosure and are intended to fall within the scope of the appended claims.

Figure 13:
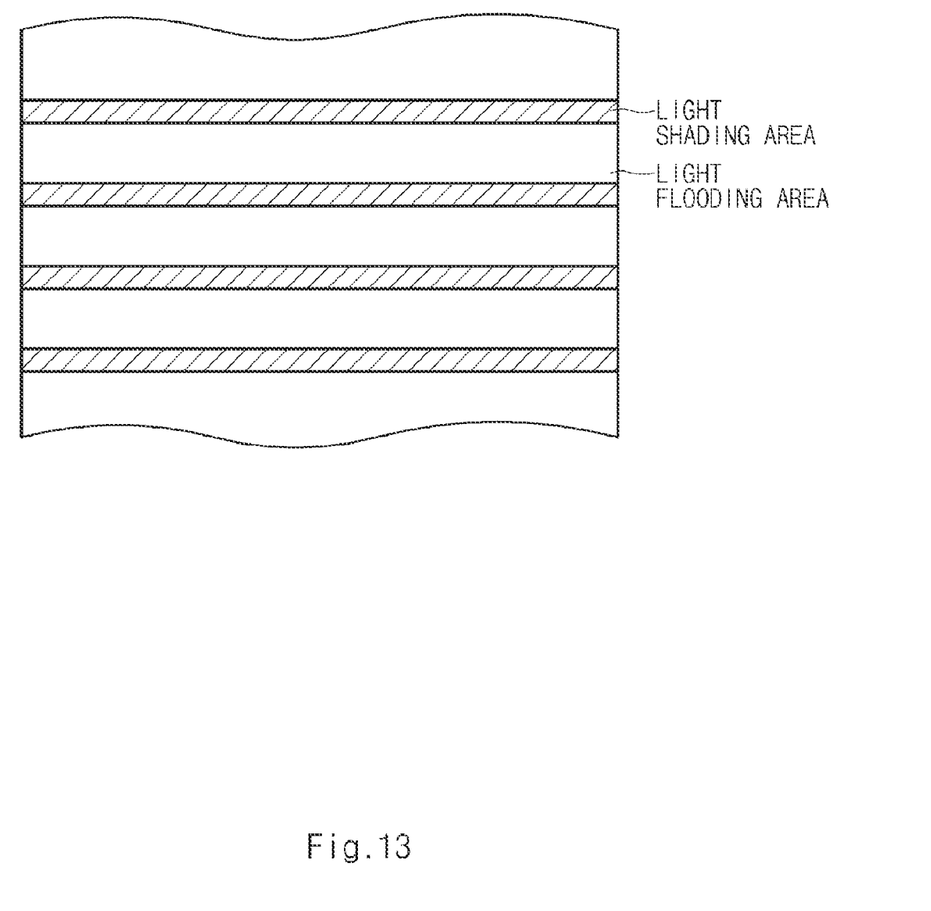
FIG. 13 is a diagram illustrating a layout of a photo mask according to an embodiment of the present invention.

For example, one embodiment illustrates the storage node contact mask in FIG. 13 which includes elongated line type light flooding areas, each of elongated line type flooding areas being disposed at each of regions between the gate electrodes. However, a plurality of short line type flooding areas, each of which includes at least adjacent two storage node contact regions may be disposed at each of regions between the gates.

What is claimed is:
1. A method for manufacturing a semiconductor device, the method comprising:
    forming an isolation structure defining an active region;

forming gates buried within the active region and the isolation structure;
forming an interlayer insulating layer over the active region and the isolation structure;
etching the interlayer insulating layer to form a trench that defines a bit line region;
forming a spacer insulating layer over a sidewall of the trench;
forming a bit line within the trench, the bit line having a first hard mask layer stacked thereon;
forming a storage node contact hole exposing a storage node contact region of the active region by using a difference in an etch characteristic between the interlayer insulating layer and the first hard mask layer; and
filling storage node material within the storage node contact hole to form a storage node contact.

2. The method of claim 1, wherein the bit line having a narrow portion and a wide portion connected to the narrow portion to resemble a dog bone shape.

3. The method of claim 2, wherein the forming-a-bit-line step includes:
forming a bit line groove having a shape resembling the dog bone shape in the interlayer insulating layer;
forming the bit line in a lower portion of the bit line groove; and
forming the first hard mask layer over the bit line to be filled in the bit line groove.

4. The method of claim 3, wherein the forming-a-bit-line-groove step includes:
forming a trench in the interlayer insulating layer by using a first bit line mask that defines a line-type bit line region;
forming a second hard mask layer on the interlayer insulating layer to be buried within the trench;
etching the interlayer insulating layer and the second hard mask layer by using a second bit line mask which defines a hole type bit line contact region; and
removing the second hard mask layer remaining within the trench,
wherein the line-type bit line region corresponds to the narrow portion of the bit line and the hole type bit line contact region corresponds to the wide portion of the bit line.

5. The method of claim 4, wherein the second hard mask layer is formed by an amorphous carbon layer (ACL) or a spin on coating (SOC) type polymer.

6. The method of claim 3, wherein the bit line includes a barrier metal layer and a bit line conduction layer.

7. The method of claim 6, wherein the forming-a-bit-line step includes:
forming the barrier metal layer on an inner surface of the bit line groove;
forming the bit line conduction layer on the barrier metal layer within the bit line groove; and
etching back the barrier metal layer and the bit line conduction layer.

8. The method of claim 3, further including:
forming a spacer insulating layer on the inner surface of the bit line groove, the inner surface including a bottom surface and a sidewall; and
removing a portion of the spacer insulating layer formed on a bottom surface of the bit line contact region, the spacer insulating layer remaining on the sidewall of the bit line groove.

9. The method of claim 8, wherein the forming-a-bit-line-groove resembling the dog bone shape includes:
forming a trench in the interlayer insulating layer by using a first bit line mask that defines a line-type bit line region;
forming a second hard mask layer within the trench;
etching the interlayer insulating layer and the second hard mask layer by using a second bit line mask which defines a hole type bit line contact region; and
removing the second hard mask layer remaining within the trench.

10. The method of claim 9, wherein the second hard mask layer is formed by a ACL or a SOC type polymer.

11. The method of claim 8, wherein the bit line includes a barrier metal layer and a bit line conduction layer.

12. The method of claim 11, wherein the-forming-a-bit-line step includes:
forming the barrier metal layer on the inner surface of the bit line groove;
forming the bit line conduction layer on the barrier metal layer within the bit line groove; and
etching back the barrier metal layer and the bit line conduction layer.

13. The method of claim 1, wherein the forming-a-storage-node-contact-hole step includes:
forming a photosensitive pattern exposing portions of the interlayer insulating layer and the first hard mask layer that are provided on regions between the ent gates; and
etching the exposed portions of the interlayer insulating layer and the first hard mask layer until the active region of the storage node contact region is exposed by using the photosensitive pattern as an etch mask.

14. The method of claim 13, wherein the photosensitive pattern having line patterns that are provided on the regions between the gates such that the portions of the interlayer insulating layer and the first hard mask layer corresponding to the regions are exposed.

15. The method of claim 13, wherein the photosensitive pattern having a plurality of line patterns which are provided on the regions between the gates, each line pattern having a length including adjacent two storage node contact regions such that each of the plurality of line patterns exposes the portions of the interlayer insulating layer and the first hard mask layer.

16. The method of claim 1, wherein the uppermost portion of the storage node contact is higher than the uppermost portion of the bit line.

* * * * *